United States Patent
Singh et al.

(10) Patent No.: US 9,576,894 B2
(45) Date of Patent: Feb. 21, 2017

(54) INTEGRATED CIRCUITS INCLUDING ORGANIC INTERLAYER DIELECTRIC LAYERS AND METHODS FOR FABRICATING THE SAME

(71) Applicant: GLOBALFOUNDRIES, INC., Grand Cayman (KY)

(72) Inventors: Sunil Kumar Singh, Mechanicville, NY (US); Ravi Prakash Srivastava, Clifton Park, NY (US); Xusheng Wu, Ballston Lake, NY (US); Akshey Sehgal, Malta, NY (US); Teck Jung Tang, Ballston Lake, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/729,188

(22) Filed: Jun. 3, 2015

(65) Prior Publication Data

US 2016/0358851 A1 Dec. 8, 2016

(51) Int. Cl.
| | |
|---|---|
| *H01L 23/522* | (2006.01) |
| *H01L 21/768* | (2006.01) |
| *H01L 21/02* | (2006.01) |
| *H01L 23/532* | (2006.01) |
| *H01L 21/311* | (2006.01) |

(52) U.S. Cl.
CPC ..... *H01L 23/5226* (2013.01); *H01L 21/02118* (2013.01); *H01L 21/02167* (2013.01); *H01L 21/02282* (2013.01); *H01L 21/31144* (2013.01); *H01L 21/7684* (2013.01); *H01L 21/76802* (2013.01); *H01L 21/76807* (2013.01); *H01L 21/76811* (2013.01); *H01L 21/76826* (2013.01); *H01L 21/76843* (2013.01); *H01L 21/76871* (2013.01); *H01L 21/76877* (2013.01); *H01L 23/53295* (2013.01)

(58) Field of Classification Search
CPC ............. H01L 21/02362; H01L 21/02167; H01L 21/76802; H01L 21/76807; H01L 21/76871; H01L 21/76877; H01L 23/5226; H01L 21/76811; H01L 21/31144
See application file for complete search history.

(56) References Cited

U.S. PATENT DOCUMENTS

| | | | | |
|---|---|---|---|---|
| 6,165,899 A * | 12/2000 | Matumoto | ........ | H01L 21/76808 257/E21.579 |
| 6,593,246 B1 * | 7/2003 | Hasegawa | ......... | H01L 21/02118 257/E21.256 |
| 7,534,721 B2 * | 5/2009 | Kanamura | ........ | H01L 21/76811 257/E21.579 |
| 7,829,454 B2 * | 11/2010 | Suzuki | .............. | H01L 21/28562 257/E21.584 |
| 8,114,769 B1 * | 2/2012 | Srivastava | ........ | H01L 21/31144 257/E21.579 |

(Continued)

*Primary Examiner* — Joseph C Nicely
(74) *Attorney, Agent, or Firm* — Lorenz & Kopf, LLP

(57) ABSTRACT

Integrated circuits and methods for fabricating integrated circuits are provided. In one example, a method for fabricating an integrated circuit includes depositing an organic dielectric material overlying a semiconductor substrate for forming an organic interlayer dielectric (OILD) layer. An opening is formed in the OILD layer and a conductive metal fill is deposited in the opening for forming a metal line and/or a via.

20 Claims, 5 Drawing Sheets

(56) References Cited

U.S. PATENT DOCUMENTS

| | | | |
|---|---|---|---|
| 8,518,825 B1* | 8/2013 | Mao | H01L 21/0273 257/774 |
| 2003/0227086 A1* | 12/2003 | Otsuka | H01L 21/76801 257/758 |
| 2004/0018714 A1* | 1/2004 | Cooney, III | H01L 21/76811 438/618 |
| 2004/0227242 A1* | 11/2004 | Noguchi | H01L 21/314 257/751 |
| 2007/0054486 A1* | 3/2007 | Yang | H01L 21/76807 438/637 |
| 2007/0155027 A1* | 7/2007 | Ditizio | H01L 43/12 438/3 |
| 2007/0164434 A1* | 7/2007 | Watanabe | H01L 23/5223 257/758 |
| 2008/0026563 A1* | 1/2008 | Kanamura | H01L 21/76811 438/623 |
| 2008/0038934 A1* | 2/2008 | Vrtis | H01L 21/02115 438/759 |
| 2008/0048328 A1* | 2/2008 | Lin | H01L 23/5283 257/759 |
| 2008/0070325 A1* | 3/2008 | Tolpygo | H01L 39/2493 438/2 |
| 2010/0055897 A1* | 3/2010 | Chou | C11D 3/3947 438/638 |
| 2011/0018006 A1* | 1/2011 | Huh | H01L 33/34 257/88 |
| 2011/0212616 A1* | 9/2011 | Seidel | H01L 21/31144 438/652 |
| 2011/0306214 A1* | 12/2011 | Zin | H01J 37/32082 438/714 |
| 2012/0003759 A1* | 1/2012 | Hu | B24B 37/013 438/8 |
| 2012/0153480 A1* | 6/2012 | Pfuetzner | H01L 21/76814 257/751 |
| 2012/0223439 A1* | 9/2012 | Blatchford | H01L 23/5226 257/774 |
| 2012/0309114 A1* | 12/2012 | Yao | H01L 21/02126 438/4 |
| 2013/0009315 A1* | 1/2013 | Colburn | H01L 23/5222 257/774 |
| 2014/0117381 A1* | 5/2014 | Kang | H01L 21/02576 257/77 |
| 2014/0163350 A1* | 6/2014 | Huh | H01L 31/18 600/395 |
| 2014/0273470 A1* | 9/2014 | Lin | H01L 21/02175 438/702 |
| 2014/0308810 A1* | 10/2014 | Ko | H01L 21/475 438/653 |
| 2015/0041793 A1* | 2/2015 | Chan | H01L 51/0018 257/40 |
| 2015/0069622 A1* | 3/2015 | Lu | H01L 21/0337 257/774 |
| 2015/0072519 A1* | 3/2015 | Lu | H01L 21/76829 438/626 |
| 2015/0206944 A1* | 7/2015 | Riedel | G02F 1/1345 257/774 |
| 2015/0214101 A1* | 7/2015 | Ren | H01L 21/3065 438/704 |
| 2015/0221547 A1* | 8/2015 | Arnold | H01L 21/31116 438/618 |
| 2015/0262873 A1* | 9/2015 | Chu | H01L 23/5226 257/773 |
| 2015/0291415 A1* | 10/2015 | Haney | B81B 1/00539 257/414 |
| 2015/0311113 A1* | 10/2015 | Zhang | H01L 21/76802 257/773 |
| 2015/0364420 A1* | 12/2015 | Lin | H01L 23/5283 257/775 |
| 2015/0371940 A1* | 12/2015 | Liu | H01L 21/76879 257/750 |
| 2016/0068384 A1* | 3/2016 | Cui | B81C 1/00111 257/618 |
| 2016/0079161 A1* | 3/2016 | Lin | H01L 23/5226 257/774 |
| 2016/0141250 A1* | 5/2016 | Bao | H01L 23/53238 257/751 |
| 2016/0225665 A1* | 8/2016 | Yoo | H01L 23/53266 |
| 2016/0233085 A1* | 8/2016 | Yamaguchi | H01L 21/02126 |
| 2016/0233132 A9* | 8/2016 | Kirkpatrick | H01L 21/823864 |

* cited by examiner

INTEGRATED CIRCUITS INCLUDING ORGANIC INTERLAYER DIELECTRIC LAYERS AND METHODS FOR FABRICATING THE SAME

TECHNICAL FIELD

The technical field relates generally to integrated circuits, and more particularly relates to integrated circuits including interlayer dielectric layers formed of organic dielectric materials and methods for fabricating such integrated circuits.

BACKGROUND

Integrated circuits (ICs) typically include a plurality of semiconductor devices and interconnect wiring. Networks of metal interconnect wiring are often used to connect the semiconductor devices from the semiconductor portion of the substrate. Multiple levels of metal interconnect wiring form a plurality of metallization layers above the semiconductor portion of the substrate and are connected together to form a back-end-of-the-line ("BEOL") interconnect structure. Within such a structure, metal lines in the metallization layers run parallel to the substrate and conductive vias run perpendicular to the substrate between the metallization layers to interconnect the metal lines.

High performance of contemporary ICs may be achieved using a highly conductive metal, such as copper, as the interconnect metal of the BEOL interconnect structure. The BEOL interconnect structure also employs a low dielectric constant (low-k) dielectric material as an interlayer or inter-level dielectric (ILD) layer or layers between and/or about the interconnect metal of the structure.

Conventional fabrication of BEOL interconnect structures include forming an ILD layer of a dielectric material such as porous silicon dioxide overlying a semiconductor substrate. A hard mask layer is then deposited and patterned overlying the ILD layer. Using the patterned hard mask layer as an etch mask, openings including via-holes and metal line trenches are etched into the ILD layer. The via-holes and metal line trenches are then cleaned and filled with a conductive metal to form the conductive vias and metal lines that form part of the BEOL interconnect structure. Any overburden of the conductive metal above the ILD layer is typically removed by a chemical mechanical planarization (CMP) process. Unfortunately, during etching, cleaning, and/or CMP, damage and/or dimensional variations across the wafer can occur to the dielectric material particularly in areas proximate the via-holes and conductive vias, and/or the metal line trenches and metal lines. This can result, for example, in variations in wire resistance of the metal lines and/or reduce chamfer control of the conductive vias.

Additionally, during normal operation of the IC, chip pack interactions (CPI) can occur in which the temperature of the IC will generally increase due to, for example, the relatively large power consumption by the semiconductor devices. This increased temperature can produce relatively high thermal stresses in the IC including in the BEOL interconnect structure due to the thermal expansion differences between the conductive metal(s) and the dielectric material(s) that form the interconnect structure. These relatively high thermal stresses can result in reliability issues resulting from, for example, cracking and/or delamination (e.g., peeling) of or between the various metallization layers.

Accordingly, it is desirable to provide integrated circuits with improved metal resistance uniformity, via chamfer control, and/or robustness to chip package interactions and methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes depositing an organic dielectric material overlying a semiconductor substrate for forming an organic interlayer dielectric (OILD) layer. An opening is formed in the OILD layer and a conductive metal fill is deposited in the opening for forming a metal line and/or a via.

In accordance with another exemplary embodiment, a method for fabricating an integrated circuit is provided. The method includes forming an interlayer dielectric (ILD) layer of dielectric material overlying a metallization layer above a semiconductor substrate. The metallization layer includes a metal line. An organic dielectric material is deposited overlying the ILD layer for forming an organic interlayer dielectric (OILD) layer. The OILD layer and the ILD layer are selectively etched to form a via-hole extending towards the metal line. A via is formed in the via-hole electrical coupled to the metal line.

In accordance with another exemplary embodiment, an integrated circuit is provided. The integrated circuit includes a semiconductor substrate. An organic interlayer dielectric (OILD) layer of organic dielectric material overlies the semiconductor substrate. An opening is formed in the OILD layer and a conductive metal fill is disposed in the opening.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
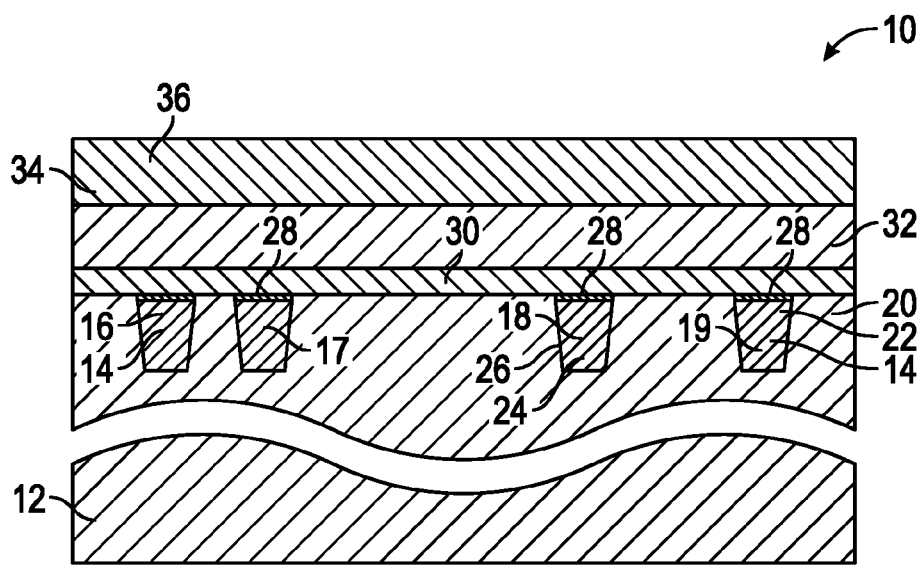
FIGS. 1-9 illustrate, in cross-sectional views, a method for fabricating an integrated circuit during various intermediate fabrication stages in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits including forming a back-end-of-the-line (BEOL) interconnect structure. In an exemplary embodiment, formation of the BEOL interconnect structure includes forming an interlayer dielectric (ILD) layer of dielectric material such as porous silicon dioxide overlying a metallization layer above a semiconductor substrate. The metallization layer includes a first metal line. As used herein, the term "overlying" means "over" such that an intervening layer may lie between the ILD layer and the metallization layer, and "on" such that the ILD layer physically contacts the metallization layer. As used herein, the term "above" means "over" such that an intervening layer may lie between the metallization layer and the semiconductor substrate, and "on" such that the metallization layer physically contacts the semiconductor substrate.

An organic dielectric material, such as, for example, a carbon-based polymeric material, is deposited overlying the ILD layer to form an organic interlayer dielectric (OILD) layer. In particular, it is to be appreciated that the carbon-based polymeric material may be in polymeric form before deposition over the ILD layer or, alternatively, may be formed by depositing polymeric precursors (e.g., monomers and/or oligomers) of the carbon-based polymeric material over the ILD layer followed by curing of the polymeric precursors to form the carbon-based polymeric material over the ILD layer. In an exemplary embodiment, the OILD layer and the ILD layer are selectively etched to form an opening extending towards the metal line. As referred to herein, the "opening" can include a metal line trench or a via-hole, and can further include both a metal line trench and a via-hole. In an exemplary embodiment, the opening is cleaned using, for example, a wet etching process to remove any trace organic dielectric material in the opening that may remain over the first metal line after formation of the opening. A conductive metal fill is deposited in the opening for forming a second metal line and/or a via that is electrically coupled to the first and/or second metal line(s). In an exemplary embodiment, a CMP process is used to remove any overburden of conductive metal fill and to expose an upper surface portion of the OILD layer.

In an exemplary embodiment, it has been found that by using an OILD layer in the BEOL interconnect structure, the organic dielectric material is resilient resisting damage and/or dimensional variations across the wafer from etching and/or cleaning of the opening, and/or CMP, thereby resulting in improved metal resistance uniformity of the metal line(s) and/or chamfer control of the via(s). Additionally, in an exemplary embodiment and without being bound by any particular theory, it has been found that the organic dielectric material of the OILD layer is relatively compliant compared to more conventional ILD layer-forming materials such as porous silicon dioxide, and it is believed that this feature of the organic dielectric material helps mitigate or reduce thermal stresses in the BEOL interconnect structure that may be caused from thermal expansion differences between the conductive metal fill and the dielectric material(s) to improved robustness to CPI.

FIGS. 1-9 illustrate, in cross-sectional view, an integrated circuit (IC) 10 during various fabrication stages. The described process steps, procedures, and materials are to be considered only as exemplary embodiments designed to illustrate to one of ordinary skill in the art methods for fabricating integrated circuits; the methods for fabricating integrated circuits are not limited to these exemplary embodiments. Various steps in the manufacture of ICs are well known and so, in the interest of brevity, many conventional steps will only be mentioned briefly herein or will be omitted entirely without providing the well-known process details.

FIG. 1 illustrates a portion of the IC 10 during an intermediate fabrication stage in accordance with an exemplary embodiment. The IC 10 includes a semiconductor substrate 12 that may represent any appropriate carrier material, such as silicon or silicon-based materials, and the like. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

Additionally, the semiconductor substrate 12 may include active areas (not shown) in which a plurality of active and/or passive circuit elements (not shown), such as transistors, capacitors, resistors, and the like may be formed therein and/or thereon. It should be appreciated that the semiconductor substrate 12, even if including a substantially silicon-based material layer, may include other semiconducting materials in addition to appropriate dopant species for establishing the requisite active area conductivity type for the circuit elements.

In an embodiment and as illustrated in FIG. 1, above the semiconductor substrate 12, the IC 10 includes a conductive interconnect structure 14 that includes metal lines 16, 17, 18, and 19 that are disposed in an interlayer dielectric (ILD) layer 20 of dielectric material. The ILD layer 20 may include a suitable dielectric material, such as silicon dioxide ($SiO_2$), organosilicate glass, or the like. In an exemplary embodiment, the ILD layer 20 is a dielectric material that includes silicon and oxygen, such as $SiO_2$. The ILD layer 20 may be relatively thick with a thickness, for example, of from about 200 to about 1500 nm.

Electrical connection(s) between the conductive interconnect structure 14 and the electrical devices (not shown) that may be disposed on and/or in the semiconductor substrate 12 can be established with one or more conductive vias (not shown) in the ILD layer 20. It is to be appreciated that, depending on the overall device requirements, the IC 10 may include many conductive interconnect structures 14 that may be disposed, for example, in one or more layers in which each layer defines a metallization layer 22. The metallization layers may be connected together to form a back-end-of-the-line ("BEOL") interconnect structure in accordance with conventional BEOL techniques.

The exemplary metal lines 16, 17, 18, 19 are formed of a conductive metal fill 24 that may also include a conductive seed layer (not shown) and a liner 26. An exemplary conductive metal fill 24 is a highly conductive material such as copper. An exemplary liner 26 is one or more layers of a liner-forming material(s) such as tantalum (Ta), tantalum nitride (TaN), ruthenium (Ru), and/or the like to help inhibit or prevent diffusion of the conductive metal fill 24 into the ILD layer 20 and/or to help hold the conductive metal fill 24 to the ILD layer 20. In an exemplary embodiment, the liner 26 is formed of multiple layers including a barrier layer of Ta with one or more overlying liner layers of TaN. In an exemplary embodiment, the liner 26 has a thickness of from about 0.5 to about 10 nm.

As illustrated, metal caps 28 are disposed correspondingly directly overlying the metal lines 16, 17, 18, and 19. Exemplary metal caps 28 may be formed of cobalt, ruthenium, alloys thereof, or the like. Overlying the metal caps 28 and the ILD layer 20 is an etch stop layer 30 (e.g., N-doped silicon carbide (SiCN) layer). In an exemplary embodiment, the metal caps 28 have a thickness of from about 5 to about 20 nm, and the etch stop layer 30 has a thickness of from about 10 to about 50 mm.

The illustrated portion of the IC 10 from the semiconductor substrate 12 to the etch stop 30 may be formed in accordance with conventional techniques. In an exemplary embodiment, the ILD layer 20 is formed by depositing a dielectric material such as $SiO_2$ that includes organic porogen overlying the semiconductor substrate 12. The dielectric material may be deposited using a chemical vapor deposition (CVD) process and the dielectric material may be treated, for example with ultraviolet (UV) radiation, to out gas the porogen and form pores (e.g., porosity) in the ILD layer 20 to further lower the dielectric constant of the dielectric material. Next, the exemplary ILD layer 20 is patterned and etched using, for example, a dry etching process to form metal line trenches as well as via-holes (not shown). The metal line trenches and via-hole are then filled by depositing the liner-forming material(s) and the conductive metal fill 24 into the trenches and holes, such as by using a physical vapor deposition (PVD) process (or an atomic layer deposition (ALD) process) and an electrochemical plating (ECP) process, respectively, to form the conductive interconnect structure 14. Any overburden of the conductive metal fill 24 and/or the liner-forming material(s) is removed by chemical mechanical planarization (CMP) to expose upper surfaces of the ILD layer 20 and the metal lines 16, 17, 18, and 19. Next, the metal caps 28 are selectively formed on the upper surfaces of the metal lines 16, 17, 18, and 19, for example, by selectively growing a metal (e.g., Co, Ru, or the like) in a substantially vertical direction from the upper surfaces of the metal lines 16, 17, 18, and 19 using, for example, a CVD process or an electroless deposition process. The etch stop layer 30 is formed overlying the ILD layer 20 and the metal caps 28 using a CVD process.

With continued reference to FIG. 1, in an exemplary embodiment, the process continues by forming an ILD layer 32 of dielectric material overlying the etch stop layer 30. The ILD layer 32 may be formed similarly to the ILD layer 20, for example, by depositing a dielectric material such as $SiO_2$ that includes organic porogen overlying the etch stop layer 30 using a CVD process and the dielectric material may be treated, for example with UV radiation, to out gas the porogen and form porosity in the ILD layer 32. Other dielectric materials and/or techniques known to those skilled in the art for forming interlayer or interlevel dielectric layers for ICs may also be used to form the ILD layer 32. In an exemplary embodiment, the ILD layer 32 has a thickness, for example, of from about 30 to about 750 nm.

As illustrated, an organic dielectric material 34 is deposited overlying the ILD layer 32 to form an organic interlayer dielectric (OILD) layer 36. In an exemplary embodiment, the organic dielectric material 34 is an organic material selected from polyimides, polyamides, polyesters, aromatic polymers, polyarylene-ether, fluorine doped polyarylene-ether, fluorine doped amorphous carbon, and/or polytetrafluoroethylene (PTFE). In an exemplary embodiment, the OILD layer 36 has a dielectric constant of from about 1.9 to about 4, such as from about 1.9 to about 3.2, such as from about 2 to about 2.7, for example, from about 2.2 to about 2.5. In an exemplary embodiment, the OILD layer has a thickness of from about 30 to about 750 nm.

In an exemplary embodiment, the organic dielectric material 34 may be deposited overlying the ILD layer 32 using a spin coating process or the like. Alternatively, other techniques known to those skilled in the art for depositing organic materials may be used. Once deposited, the organic dielectric material 34 may be exposed to heat and/or ultraviolet radiation to evaporate any solvent(s) (if present) and/or to cure, set, harden, and/or polymerize the organic dielectric material 34. In an exemplary embodiment, the organic dielectric material 34 is heated to a temperature of from about 100 to about 350° C. for a time of about 0.5 to about 5 minutes. In another embodiment, the organic dielectric material 34 is exposed to UV radiation for a time of about 5 to about 60 seconds.

Figure 2:
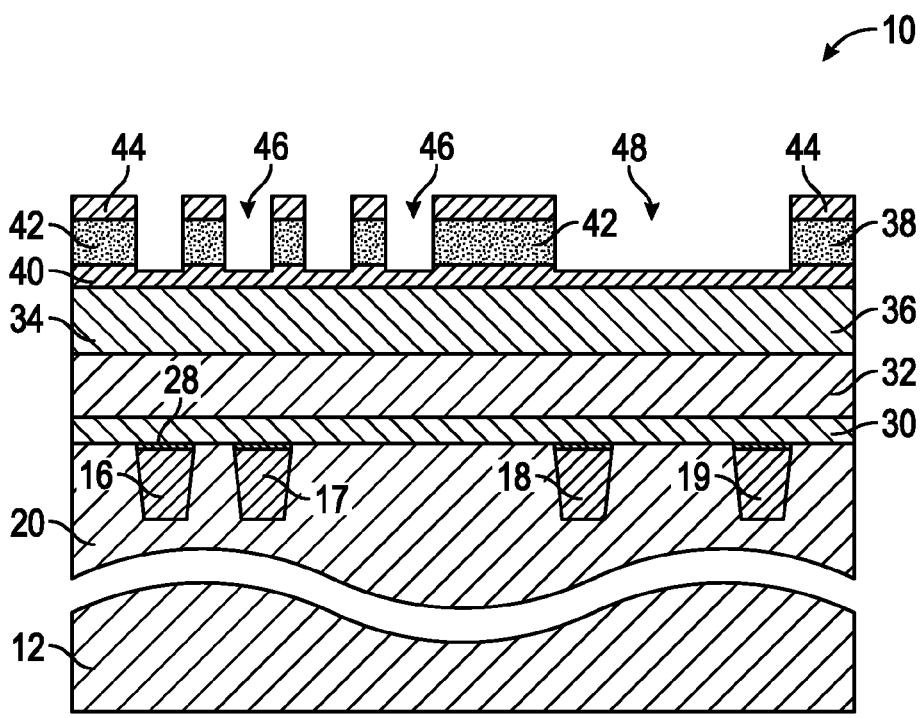

FIG. 2 illustrates the IC 10 during a further advanced fabrication stage in accordance with an exemplary embodiment. A hard mask-forming material(s) is deposited and patterned overlying the OILD layer 36 to form a patterned hard mask 38. In an exemplary embodiment, the patterned hard mask 38 is a multilayer hard mask that includes a silane hard mask layer 40, a metal hard mask layer 42, and additional silane hard mask layer 44. In an exemplary embodiment, the patterned hard mask 38 is formed by sequentially depositing the silane hard mask layer 40 by the decomposition of a source material such as tetraethylorthosilicate (TEOS), depositing a metal such as TiN as the metal hard mask layer 42, and depositing the silane hard mask layer 44 by the decomposition of a source material such as TEOS. Next, the silane hard mask layer 44 and the metal hard mask layer 42 are patterned using conventional lithography and etching techniques to form the patterned hard mask 38 that includes target metal line trench patterns 46 and 48.

Figure 3:
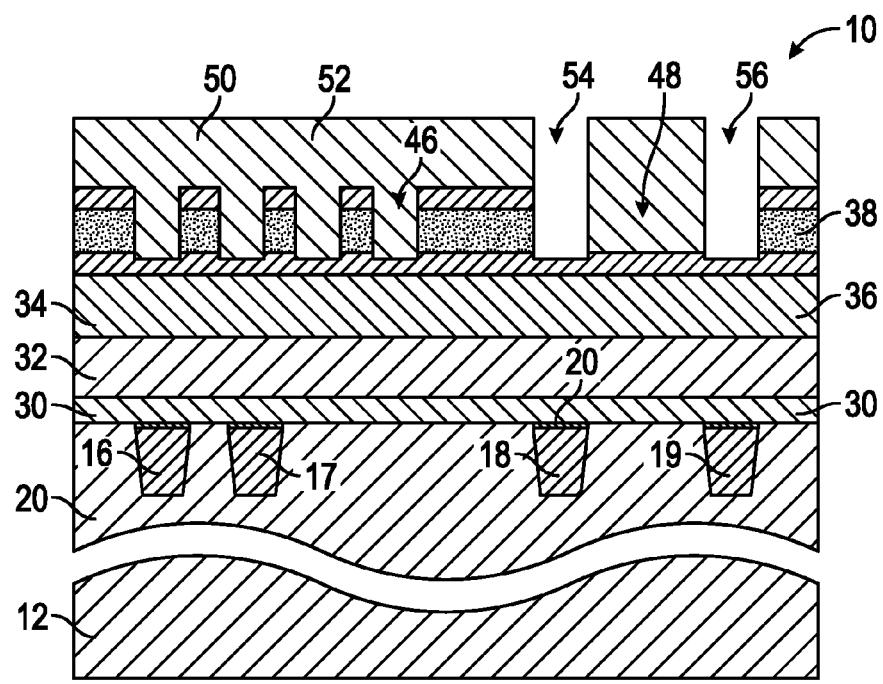

The process continues as illustrated in FIG. 3 by depositing and patterning a mask-forming material(s) 50 such as photoresist or the like to form a patterned mask 52 overlying the patterned hard mask 38 using conventional deposition, lithography, and etching techniques. In an exemplary embodiment, the patterned mask 52 includes target via-hole patterns 54 and 56 that are disposed in the target metal line trench pattern 48 and that are correspondingly vertically aligned with the metal lines 18 and 19.

Figure 4:
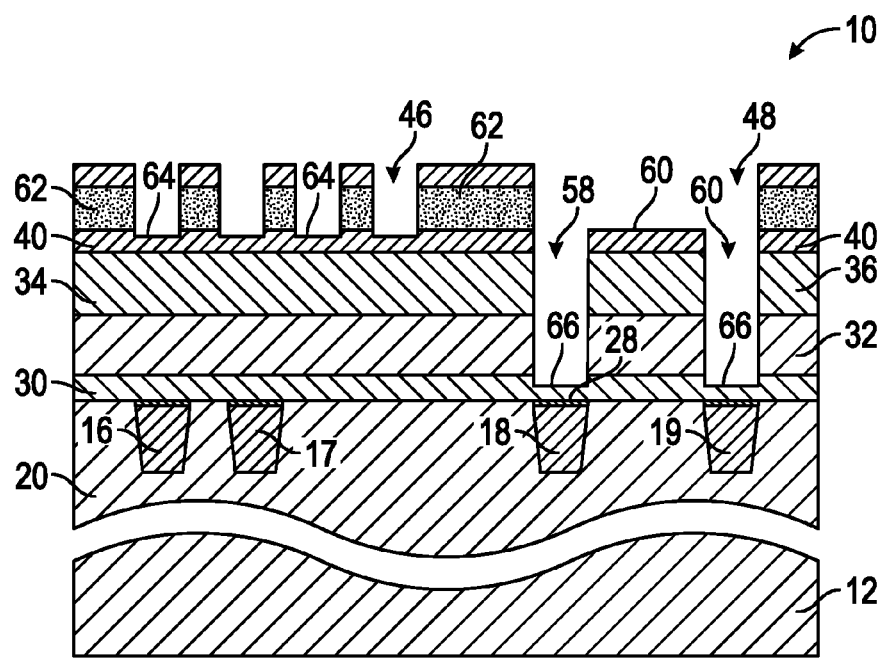

With reference also to FIG. 4, the target via-hole patterns 54 and 56 are transferred through the OLID layer 36 to the ILD layer 32 to form openings that are configured as via-holes 58 and 60 extending towards the metal lines 18 and 19, respectively. In an exemplary embodiment, the target via-hole patterns 54 and 56 are initially transferred to the patterned hard mask 38 using, for example, a dry etching process to form openings through the silane hard mask layer 40 that correspond to the target via-hole patterns 54 and 56 thereby forming a patterned hard mask 62. Using the patterned hard mask 62, either together with or after removing the patterned mask 52, as an etch mask, the via-holes 58 and 60 are formed by etching through the ILD and OILD layers 32 and 36.

In an exemplary embodiment, the via-holes 58 and 60 are formed using multiple dry etching processes. In one example, the OILD layer 36 is selectively etched using a plasma etching process that uses $CO_2/CO$, $N_2/H_2$, $CO_2$, or $NH_3$ and the ILD layer 32 is selectively etched using a separate plasma etching process that uses a fluorine based chemistry, such as, $C_xF_y$ or $C_xF_y$ and $O_2$, for example $C_4F$ or $C_4F$ and $O_2$. In an exemplary embodiment, after etching the via-holes 58 and 60 through the ILD layer 32, the etch stop layer 30 acts as an etch stop such that portions 66 of the etch stop layer 30 that are disposed directly above the metal lines 18 and 19 are exposed by the via-holes 58 and 60.

Figure 5:
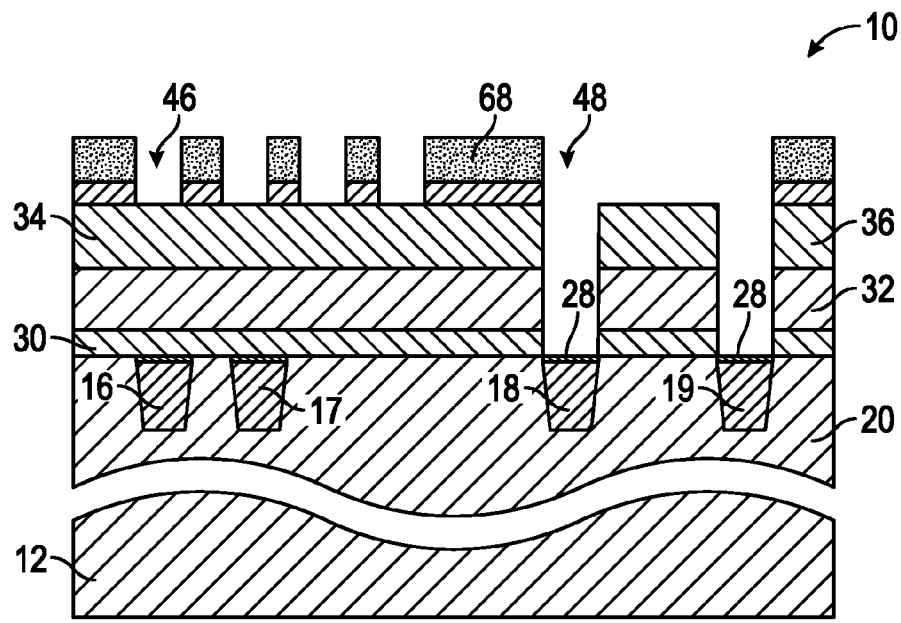

Referring to FIGS. 4-5, the process continues by exposing the IC 10 to an etching process to remove the exposed portions 66 of the etch stop layer 30, thereby exposing the metal caps 28, and to remove the silane hard mask layer 44 and the exposed portions 64 of the silane hard mask layer 40 of the patterned hard mask 62, thereby forming a patterned hard mask 68. In an exemplary embodiment, the IC 10 is exposed to a dry etching process such as a plasma etching process that uses a fluorine based chemistry, such as, $C_xF_y$, or $C_xF_y$ and $O_2$, for example $C_4F$ or $C_4F$ and $O_2$ to expose the metal caps 28 and form the patterned hard mask 68.

Figure 6:
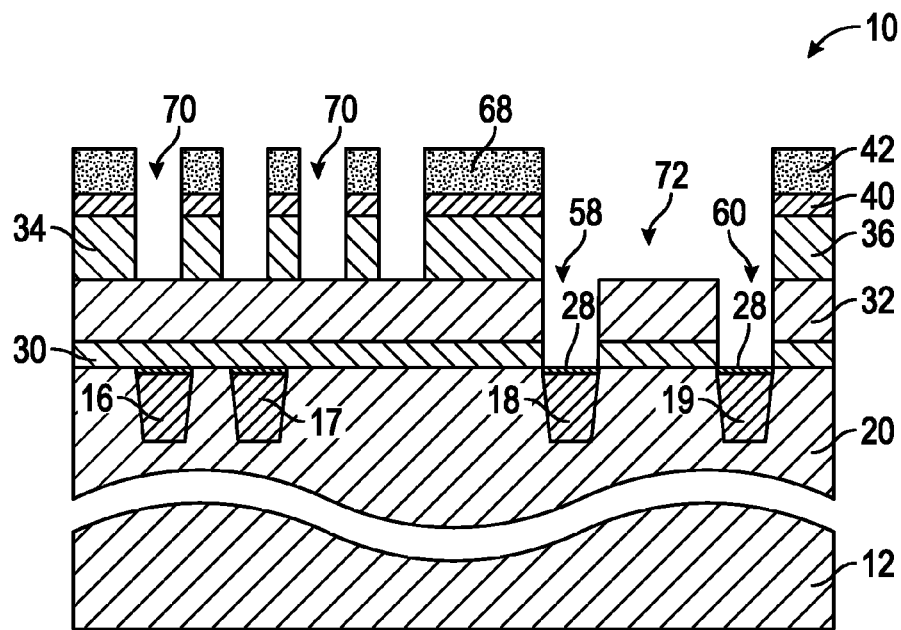

Referring to FIGS. 5-6, using an etching process, the target metal line trench patterns 46 and 48 are transferred from the patterned hard mask 68 to the OILD layer 36 to form openings correspondingly configured as a metal line trenches 70 and 72. In an exemplary embodiment, the OILD layer 36 is selectively etched using a plasma etching process that uses $CO_2/CO$, $N_2/H_2$, $CO_2$, or $NH_3$. As illustrated, the via-holes 58 and 60 are aligned with and open to the metal line trench 72, while the ILD layer 32 correspondingly forms closed-off bottom portions of the metal line trenches 70.

Figure 7:
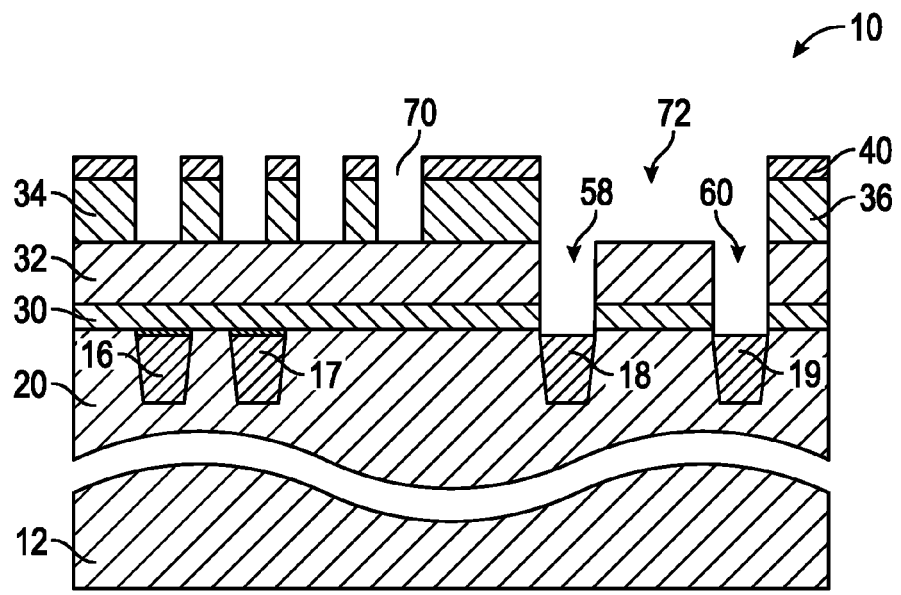

In an exemplary embodiment and referring to FIGS. 6-7, the process continues by cleaning the metal line trenches 70 and 72 and the via-holes 58 and 60. In an exemplary embodiment, the IC 10 is exposed to a wet etching process, such as, for example, an EKC clean known to those skilled in the art for TiN hard mask and etch byproduct removal, to clean the metal line trenches 70 and 72 and the via-holes 58 and 60 and to remove the metal hard mask layer 42 and the metal caps 28 thereby exposing the metal lines 18 and 19.

Figure 8:
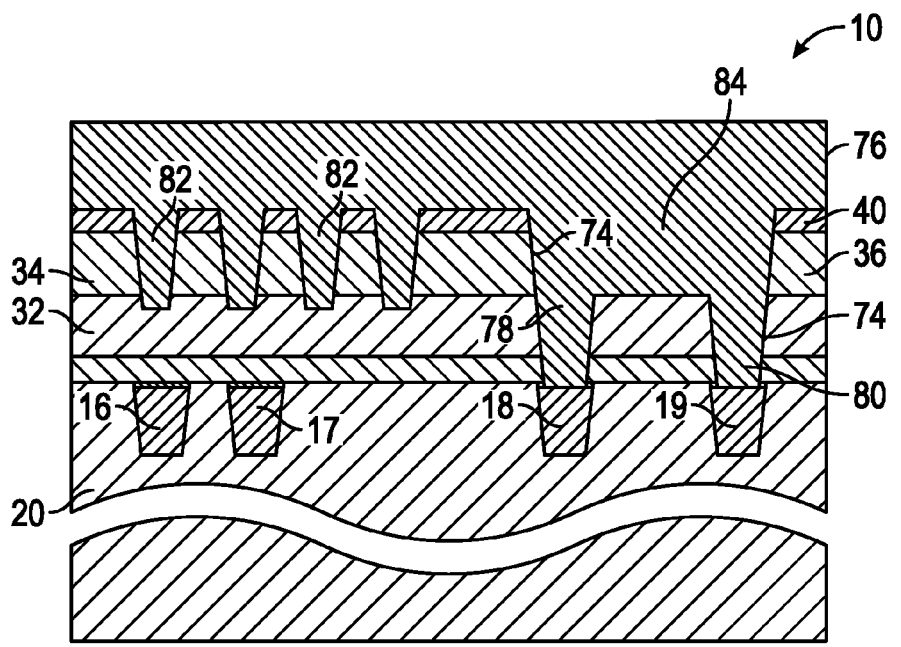

FIG. 8 illustrates the portion of the IC 10 during a further advanced fabrication stage in accordance with an exemplary embodiment. A liner-forming material(s) is deposited overlying a top surface of the silane hard mask layer 40, the sidewalls of the OILD layer 36 that define the metal line trenches 70 and 72, and the sidewalls of the ILD layer 32 that define the via-holes 58 and 60 to form a liner 74. In an exemplary embodiment, the liner-forming material(s) includes Ta, TaN, Ti, and/or TiN and is deposited using a PVD process, an ALD process, or the like.

In an embodiment, the process continues by depositing a copper seed layer (not shown) overlying the liner 74. In an exemplary embodiment, the copper seed layer is deposited using a PVD process. A conductive metal fill 76 (e.g., copper or copper alloy) is then deposited overlying the copper seed layer to form vias 78 and 80 and metal lines 82 and 84.

Figure 9:
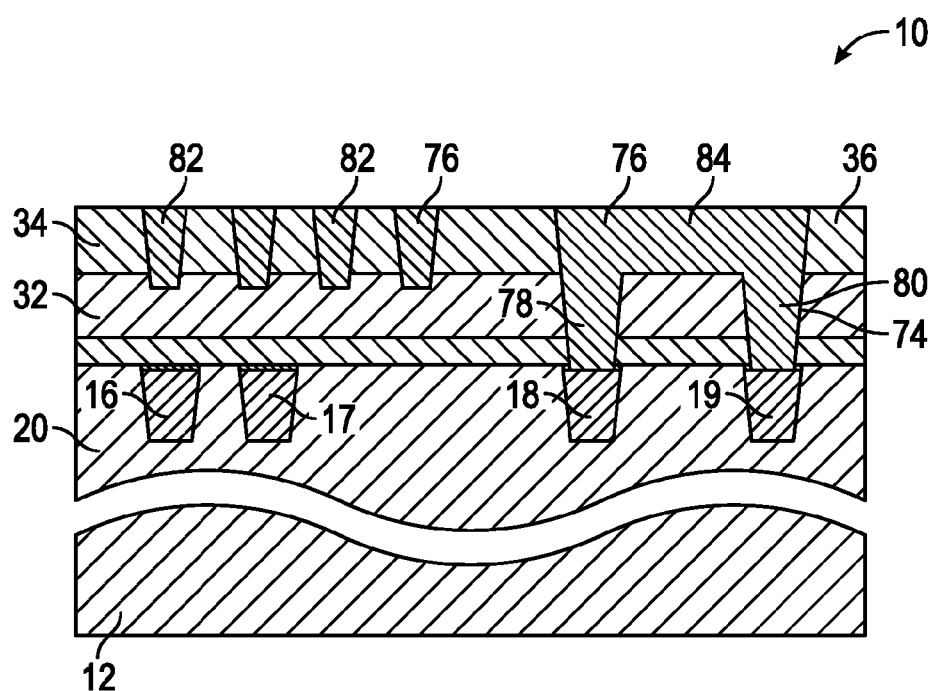

The process continues by planarizing the IC 10 using a CMP process to remove any excess conductive metal fill 76 and the silane hard mask layer 40 thereby exposing the OILD layer 36 as illustrated in FIG. 9.

Accordingly, integrated circuits and methods for fabricating integrated circuits have been described. In an exemplary embodiment, an integrated circuit is fabricated by depositing an organic dielectric material overlying a semiconductor substrate for forming an organic interlayer dielectric (OILD) layer. An opening is formed in the OILD layer and a conductive metal fill is deposited in the opening for forming a metal line and/or a via.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
depositing an organic dielectric material overlying a semiconductor substrate for forming an organic interlayer dielectric (OILD) layer;
forming a patterned hard mask overlying the OILD layer to form a first target metal line trench pattern and a second target metal line trench pattern;
forming a patterned mask overlying the patterned hard mask and the second target metal line trench pattern to form a target via-hole pattern in the first target metal line trench pattern;
forming a via-hole extending through the target via-hole pattern and in the OILD layer;
removing the patterned mask overlying the second target metal line trench pattern;
forming a metal line trench extending through the second target metal line trench pattern and in the OILD layer;
depositing a conductive metal fill in the via-hole for forming a via and in the metal line trench for forming a metal line; and
planarizing the conductive metal fill to expose an upper surface portion of the OILD layer.

2. The method of claim 1, wherein depositing the organic dielectric material comprises forming the OILD layer having a dielectric constant of from about 1.9 to about 4.

3. The method of claim 1, wherein depositing the organic dielectric material comprises depositing the organic dielectric material selected from the group consisting of polyimides, polyamides, polyesters, aromatic polymers, polyarylene-ether, fluorine doped polyarylene-ether, fluorine doped amorphous carbon, polytetrafluoroethylene (PTFE), and combinations thereof.

4. The method of claim 1, wherein depositing the organic dielectric material comprises depositing the organic dielectric material using a spin coating process.

5. The method of claim 1, wherein forming the opening comprises selectively etching the OILD layer using a plasma etching process that uses $CO_2/CO$, $N_2/H_2$, $CO_2$, or $NH_3$.

6. The method of claim 1, wherein depositing the organic dielectric material comprises forming the OILD layer having a thickness of from about 30 to about 750 nm.

7. The method of claim 1, further comprising forming an interlayer dielectric (ILD) layer of dielectric material overlying the semiconductor substrate, wherein depositing the organic dielectric material comprises forming the OILD layer overlying the ILD layer.

8. The method of claim 7, wherein forming the via-hole comprises forming the via-hole extending through the OILD and ILD layers, and wherein forming the metal line trench comprises forming the metal line trench extending through the OILD layer, and not the ILD layer.

9. The method of claim 8, wherein forming the via-hole comprises selectively etching the ILD layer using a plasma etching process that uses a fluorine based chemistry.

10. The method of claim 1, wherein depositing the conductive metal fill in the via-hole and metal line trench comprises depositing additional conductive metal fill overlying the OILD layer, and wherein planarizing the conductive metal fill to expose an upper surface portion of the OILD layer further comprises planarizing using a CMP process to remove the additional conductive metal fill and to expose the upper surface portion of the OILD layer.

11. A method for fabricating an integrated circuit, the method comprising:
   forming an interlayer dielectric (ILD) layer of dielectric material overlying a metallization layer above a semiconductor substrate, wherein the metallization layer comprises a metal line;
   depositing an organic dielectric material overlying the ILD layer for forming an organic interlayer dielectric (OILD) layer;
   forming a patterned hard mask overlying the OILD layer to form a first target metal line trench pattern and a second target metal line trench pattern;
   forming a patterned mask overlying the patterned hard mask and the second target metal line trench pattern to form a target via-hole pattern in the first target metal line trench pattern;
   selectively etching, through the target via-hole pattern, the OILD layer and the ILD layer to form a via-hole extending towards the metal line of the metallization layer;
   removing the patterned mask overlying the second target metal line trench pattern;
   selectively etching, through the second target metal line trench pattern, the OILD layer to form a metal line trench;
   depositing a conductive metal fill in the via-hole for forming a via electrically coupled to the metal line of the metallization layer and in the metal line trench for forming a metal line spaced from the metal line of the metallization layer;
   planarizing the conductive metal fill to expose an upper surface portion of the OILD layer.

12. The method of claim 11, further comprising depositing a nitrogen (N) doped silicon carbide layer overlying the metallization layer, wherein forming the ILD layer comprises forming the ILD layer overlying the N-doped silicon carbide layer.

13. The method of claim 12, wherein selectively etching comprises selectively etching the OILD and ILD layers using the N-doped silicon carbide layer as an etch stop to expose a portion of the N-doped silicon carbide layer that is disposed directly above the metal line of the metallization layer.

14. The method of claim 13, further comprising removing the portion of the N-doped silicon carbide layer using a plasma etching process.

15. The method of claim 13, further comprising:
   forming a metal cap overlying the metal line of the metallization layer, wherein depositing the N-doped silicon carbide layer comprises depositing the N-doped silicon carbide layer overlying the metal cap; and
   removing the portion of the N-doped silicon carbide layer to expose the metal cap.

16. The method of claim 15, further comprising removing the metal cap using a wet etching process to expose the metal line of the metallization layer.

17. The method of claim 11, wherein forming the via comprises forming a liner in the via-hole.

18. The method of claim 17, wherein forming the via further comprises depositing a conductive metal seed layer in the via-hole overlying the liner.

19. The method of claim 18, wherein depositing the conductive metal fill in the via-hole further comprises depositing the conductive metal fill in the via-hole overlying the conductive metal seed layer.

20. An integrated circuit comprising:
   a semiconductor substrate;
   a metallization layer overlying the semiconductor substrate, the metallization layer comprising a metal line;
   an organic interlayer dielectric (OILD) layer of organic dielectric material overlying the metallization layer and having a via-hole and a metal line trench formed in the OILD layer; and
   a conductive metal fill disposed in the via-hole to form a via and in the metal line trench to form a metal line;
   wherein the via is electrically coupled to the metal line of the metallization layer and the metal line is spaced from the metal line of the metallization layer; and
   wherein an upper surface portion of the OILD layer is on the same plane as an upper surface portion of the conductive metal fill.

* * * * *